(12) United States Patent
Yamanashi et al.

(10) Patent No.: US 7,046,470 B2
(45) Date of Patent: May 16, 2006

(54) DATA STORAGE SYSTEM

(75) Inventors: Akira Yamanashi, Tokyo (JP);
Hirokazu Takahashi, Chigasaki (JP);
Takamasa Ishikawa, Minamiashigara (JP); Kenichi Tateyama, Odawara (JP)

(73) Assignee: Hitachi, Ltd., Tokyo (JP)

( * ) Notice: Subject to any disclaimer, the term of this patent is extended or adjusted under 35 U.S.C. 154(b) by 256 days.

(21) Appl. No.: 10/782,857

(22) Filed: Feb. 23, 2004

(65) Prior Publication Data
US 2004/0160720 A1 Aug. 19, 2004

Related U.S. Application Data

(63) Continuation of application No. 09/761,773, filed on Jan. 18, 2001, now abandoned.

(30) Foreign Application Priority Data

May 25, 2000 (JP) .............................. 2000-159550

(51) Int. Cl.
*G11B 15/18* (2006.01)
(52) U.S. Cl. ...................... 360/69; 360/97.02; 361/687
(58) Field of Classification Search ...................... None
See application file for complete search history.

(56) References Cited

U.S. PATENT DOCUMENTS

| 5,077,722 A | 12/1991 | Geist et al. |
| 5,247,427 A | 9/1993 | Driscoll et al. |
| 5,412,534 A * | 5/1995 | Cutts et al. ................. 361/695 |
| 5,414,591 A | 5/1995 | Kimura et al. |
| 5,438,226 A | 8/1995 | Kuchta |
| 5,570,269 A * | 10/1996 | Korikawa et al. .......... 361/685 |
| 5,579,204 A | 11/1996 | Nelson et al. |
| 5,619,486 A | 4/1997 | Uno et al. |
| 5,772,500 A | 6/1998 | Harvey et al. |
| 5,796,580 A | 8/1998 | Komatsu et al. |
| 5,809,328 A | 9/1998 | Nogales et al. |
| 5,841,997 A | 11/1998 | Bleiweiss et al. |
| 5,912,799 A | 6/1999 | Grouell et al. |
| 5,963,424 A | 10/1999 | Hileman et al. |
| 5,963,887 A | 10/1999 | Giorgio |
| 6,018,456 A | 1/2000 | Young et al. |
| 6,134,667 A | 10/2000 | Suzuki et al. |
| 6,301,105 B1 | 10/2001 | Glorioso et al. |
| 6,496,366 B1 | 12/2002 | Coglitore et al. |

FOREIGN PATENT DOCUMENTS

| JP | 2-58900 | 2/1990 |
| JP | 6-301450 | 10/1994 |
| JP | 7-050492 | 2/1995 |
| JP | 9-114553 | 5/1997 |

* cited by examiner

*Primary Examiner*—K. Wong
(74) *Attorney, Agent, or Firm*—Mattingly, Stanger, Malur & Brundidge, P.C.

(57) ABSTRACT

The information storage apparatus has an internal structure and arrangement of fans in consideration of the cooling effect. The capacity of the entire apparatus can be smaller than that of a conventional apparatus and an optimum air channel can be formed so as to maintain reliability of performance, life and the like of components at high temperatures. Further, relatively speaking, a module which does not produce a large amount of heat and does not require cooling is provided in a front stage of the channel while a module including heat-producing components and a cooling fan is provided in a rear stage of the channel.

21 Claims, 12 Drawing Sheets

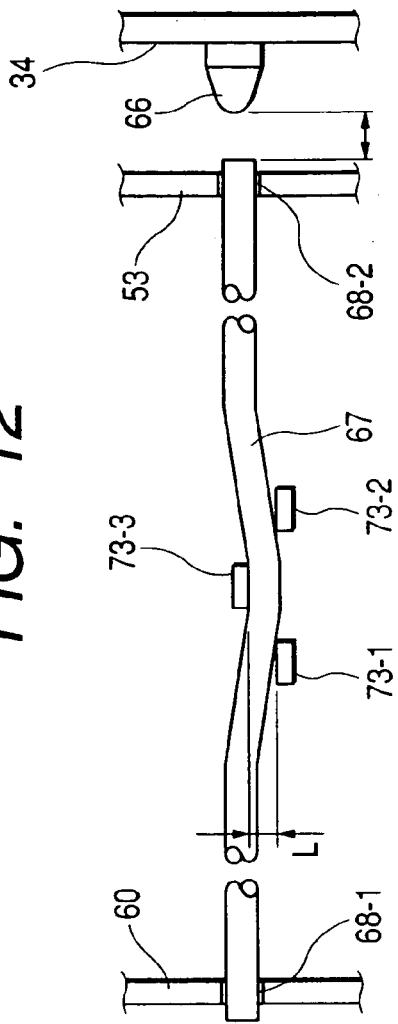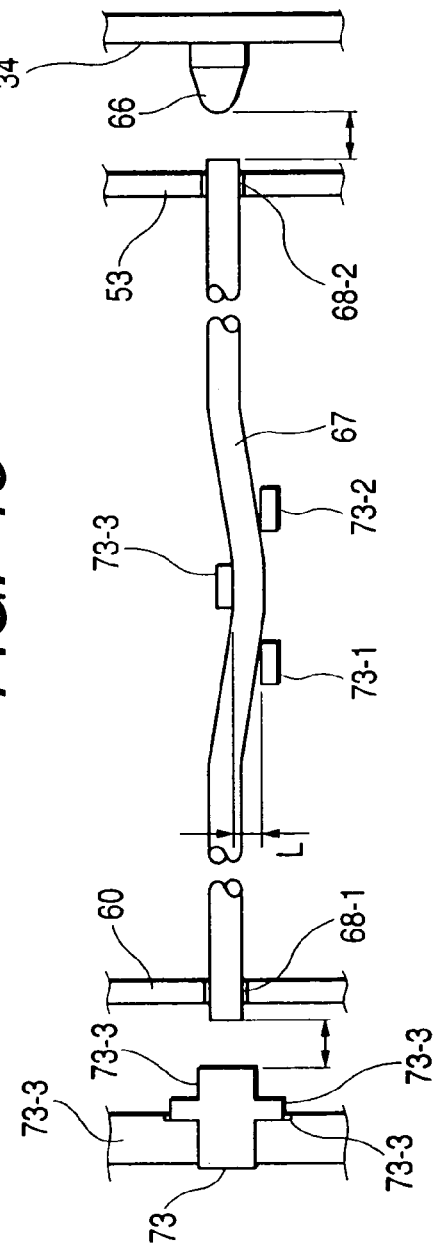

DATA STORAGE SYSTEM

This is a continuation application of U.S. Ser. No. 09/761,773, filed Jan. 18, 2001 now abandoned.

BACKGROUND OF THE INVENTION

The present invention relates to the construction, arrangement and structure of information storage apparatus and information storage control apparatus, among apparatuses constructing an information storage system, and more particularly, to cooling means for cooling internal components, transmission means for transmitting display information to a status display unit, and attachment/detachment mechanism for detachably installed modules.

In information storage apparatuses or information storage control apparatuses, it is necessary to cool down the respective modules inside the apparatus to ensure reliability. Especially, in a micro processing unit (MPU) incorporated into a control module, the computation speed is reduced at high temperatures. Further, in a hard disk drive (HDD) in an HDD module using a magnetic disk as an information recording medium, the life is shortened at high temperatures. Accordingly, these components must be cooled so as to maintain their performance.

Japanese Unexamined Patent Publication No. H9-114553 discloses an electronic equipment apparatus, mounted inside a cabinet, having a structure to take air into an OSC package having heat-producing components such as an IC chip and an LSI package, and a DC/DC converter which is also a heat-producing component, by a cooling fan provided on an apparatus side surface. In the apparatus, an I/O package is provided in a downstream position. In this structure, finally, the air is exhausted by a fan on a rear surface. Further, in the commercially available cabinet, air is generally taken in from a front surface and is exhausted to a rear surface or an upper surface.

Japanese Unexamined Patent Publication No. H7-50492 discloses a unit attachment/detachment mechanism where if the engaging force between opposite connectors is comparatively large, a pin provided in a frame of an electronic device as a fixed portion slides in a curve form ditch in eccentric cam means, then in a position passed the rotational axis of the eccentric cam means, spring means, incorporated for engagement of connectors, engages the connectors. On the other hand, generally, the engagement of connectors is maintained such that the pin comes to the position over the rotational axis.

In the structure disclosed in Japanese Unexamined Patent Publication No. H9-114553, as a particular cooling structure is arranged as the apparatus structure, the cooling means performs its function, however, the capacity of the apparatus is large due to the arrangement.

U.S. Pat. No. 5,247,427 discloses a structure where air is taken in from a front surface of an apparatus and exhausted from its rear surface, however, insertion/withdrawal of devices is not made from the rear surface.

Japanese Unexamined Patent Publication No. H2-58900 discloses a structure employing a SIROCCO fan (a multiple blade centrifugal blower) as a cooling fan. However, there is no consideration of insertion/withdrawal of devices.

Japanese Unexamined Patent Publication No. H6-301450 and other publicly-known examples disclose a structure for cooling heat-producing components. However, there is no consideration of insertion/withdrawal of devices.

Further, the inventors consider that in the point of cooling effect and various wiring structures including arrangement of components, the apparatus structure is susceptible to further improvement.

SUMMARY OF THE INVENTION

Accordingly, the present invention has been made in consideration of the above problems, and has its object to realize an arrangement of fans in consideration of cooling effect by arranging cooling means for effectively cooling necessary components without use of special cooling fan.

Further, another object of the present invention is to reduce the capacity of the entire apparatus to be smaller than those by conventional art.

Further, another object of the present invention is to ensure an optimum air channel without degradation of reliability of components with fear of loss of performance or life at high temperatures e.g. integrated circuits including a CPU.

Further, another object of the present invention is to simplify the arrangement and structure of means for transmitting statuses (performance, failure and the like) of various modules installed in the apparatus.

Further, another object of the present invention is to provide attachment/detachment mechanism with a low-price and simple structure for a comparatively light-mass unit.

Further, another object of the present invention is to provide a safe and simple structure which allows a user to conduct electrical connection between the connectors single-handedly in a stable manner.

To attain one or some combinations of the above objects, it is preferable to realize one or some combinations of the following constructions, arrangements or structures.

In case of module with reliability of life or the like to be ensured or in case of module including a part influenced by performance such as information processing speed, provided is an arrangement to directly introduce external air, i.e., an arrangement where an air channel is formed to direct an air flow toward heat-producing integrated circuits such as an MPU. Further provided is an arrangement where an air channel in a module including a cooling fan and an air channel only by a cooling fan are separately formed, and a module which does not produce much amount of heat and does not require cooling is provided in a comparatively front stage of the channel, while a module including heat-producing components and a cooling fan is provided in a comparatively rear stage of the channel. Further provided is an arrangement providing a single power supply board having electric connectors on both surfaces, where a power receiving module supplied with power via an AC cable from an external distribution panelboard or the like is integrated with a switching power source which converts AC to DC, so as to supply the DC output to a relay board. Further provided is a structure where optical transmission member is inserted between a display light emitting device on a substrate of information display part and the surface of the display part. Further provided is a distinctive attachment/detachment structure for insertion/withdrawal of unit to be inserted/withdrawn where peripheral members around an attachment/detachment cam which functions upon insertion/withdrawal are combined. Further provided is a construction where a fiber channel is used as an apparatus internal interface. Further provided is an arrangement having cooling means for exhausting cooling air by a SIROCCO fan or the like provided on an apparatus side surface.

By employing these arrangements, at least any of the following advantages can be attained, otherwise, some combinations of the following advantages can be attained. Upon arrangement of particular construction, there may be a difference in details, therefore, any of the following advantages might not be attained even in use of the concept of the present invention.

If a module with fear of degradation of reliability of life or the like at high temperatures is provided in a front stage of air channel where introduced outside air directly flows, otherwise, if the air flow is introduced to devices on the substrate with fear of degradation of performance at high temperatures, the cooling effect can be improved, the reliability of life or the like can be ensured, and degradation of performance can be prevented.

In use of arrangement where an air channel in modules including a cooling fan and an air channel only by a cooling fan are separately formed, a module which does not produce much amount of heat and does not require cooling is provided in a comparatively front stage of the channel, while a module including heat-producing components and a cooling fan is provided in a comparatively rear stage of the channel, the information storage apparatus can be downsized in front-and-rear directions, thereby the entire capacity can be reduced.

If plural modules including components requiring cooling are provided in an air channel where introduced outside air directly flows, the cooling effect can be set to a high level.

In use of structure where an optical transmission member is inserted between a display light emitting device on a substrate of information display part and the surface of the display part, a relay cable can be omitted, and a low-price and simple structure can be realized.

In introduction of novel structure in an engagement portion between an insertion/withdrawal portion of module unit to be inserted/withdrawn and a fixed portion into which the unit is to be inserted, a comparatively low-price structure can be realized at a low cost, and further, electrical connection can be mechanically made single-handedly in a stable manner.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate an embodiment of the invention and, together with the description, serve to explain the principles of the invention.

FIG. 12 is a schematic partially-cutaway diagram showing a metal tool as the optical fiber fixing means;

FIG. 13 is a schematic partially-cutaway diagram showing the metal tool as the optical fiber fixing means;

DETAILED DESCRIPTION OF THE PREFERRED EMBODIMENT

A preferred embodiment of the present invention will now be described in detail in accordance with FIGS. 1 to 19.

Figure 1:
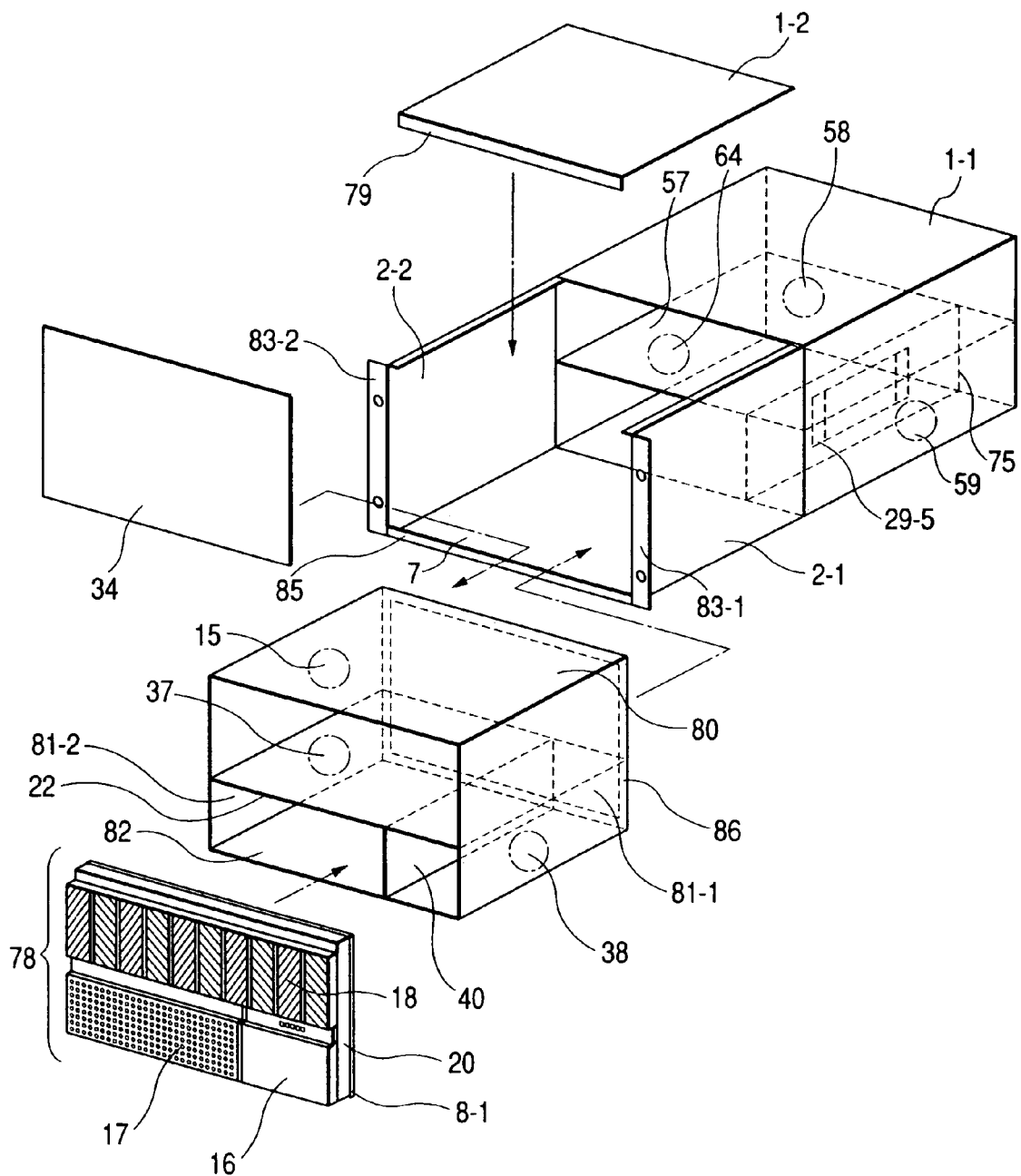
FIG. 1 is a schematic exploded perspective diagram showing a disk array apparatus.
Figure 2:
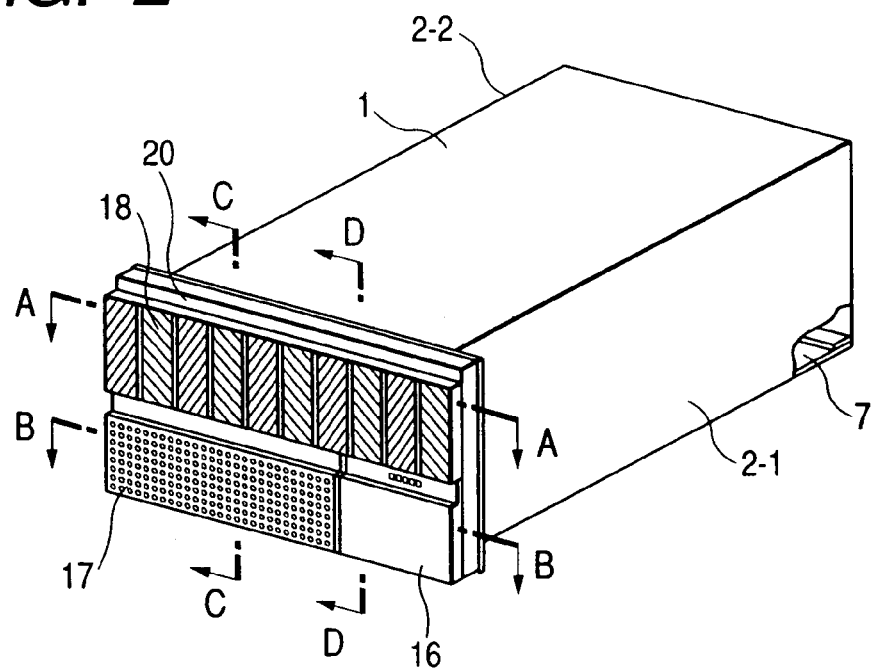
FIG. 2 is a schematic perspective diagram viewed from a front right direction of the disk array apparatus.

FIGS. 1 and 2 show a disk array apparatus as an example of the information storage apparatus or information storage control apparatus of the present invention. FIG. 1 is a schematic exploded perspective diagram showing the structure of the apparatus. FIG. 2 is a schematic perspective diagram viewed from a front right direction of the apparatus.

A rear upper plate 1-1 forming a rear surface upper wall, a lower plate 7, provided in a position opposite to the rear upper plate 1-1, forming a lower wall, a side plate 2-1 forming a right wall, a side plate 2-2 forming a left wall, are provided on a main body rear surface. A front surface of the apparatus has a front door provided with a cover 20 and the like having a bezel 78 including an operating cover 16, an air intake cover 17 having an air inlet, a louver 18 and an EMI gasket(1) 8-1. The air intake cover 17 and the louver 18 may be integrated with the cover 20 or may be separately provided from the cover 20. Bending places 83-1 and 83-2 are provided outwardly on front side of the side plate 2-1 forming the right wall and the side plate 2-2 forming the left wall, and a tie 85 is provided inwardly on the lower plate 7 forming the lower wall.

A front surface container has an upper plate 80, a lower plate 82 provided in a position opposite to the upper plate 80, side walls 81-1 and 81-2 on both sides, a tie 86, plural holes 29-1 to 29-4 having electrical wiring patterns (See FIGS. 5 and 6), a wiring board 34 having plural connectors for electrical connection (not shown) on both surfaces, front upper plates 1-1 and 1-2 forming a front surface upper wall, a small window 79, and the like. Further, the front surface container has a chamber(4) 15, a chamber(5) 37 and a chamber(6) 38, partitioned by a partition board(3) 22 and a partition board(4) 40.

A rear surface container has a chamber(1) 58, a chamber (3) 59 and a chamber(2) 64 partitioned by a partition board(1) 57 and a partition board(2) 75 having holes 29-5.

As an assembling procedure regarding the respective components as shown in FIG. 1, the wiring board 34 is engaged with the tie 86 of the front surface container by using a screw, then the front surface container is inserted into the main body part. Further, the front upper plate 1-1 is engaged with the ties 84-1 (not shown) and 84-2 (not shown) by using screws, then units or components in modules are inserted into the respective chambers, and finally, the bezel 78 is set by mechanical means, thus the apparatus as shown in FIG. 2 is completed.

Note that at this time, regarding the wiring board 34 with plural connectors for electrical connection on both surfaces, when the units in modules are inserted in the respective chambers, connectors of the respective units must be engaged with the connectors on the wiring board 34 with high precision. For this purpose, the board must be carefully installed into the front surface container with high precision by using positioning means or the like.

Figure 3:
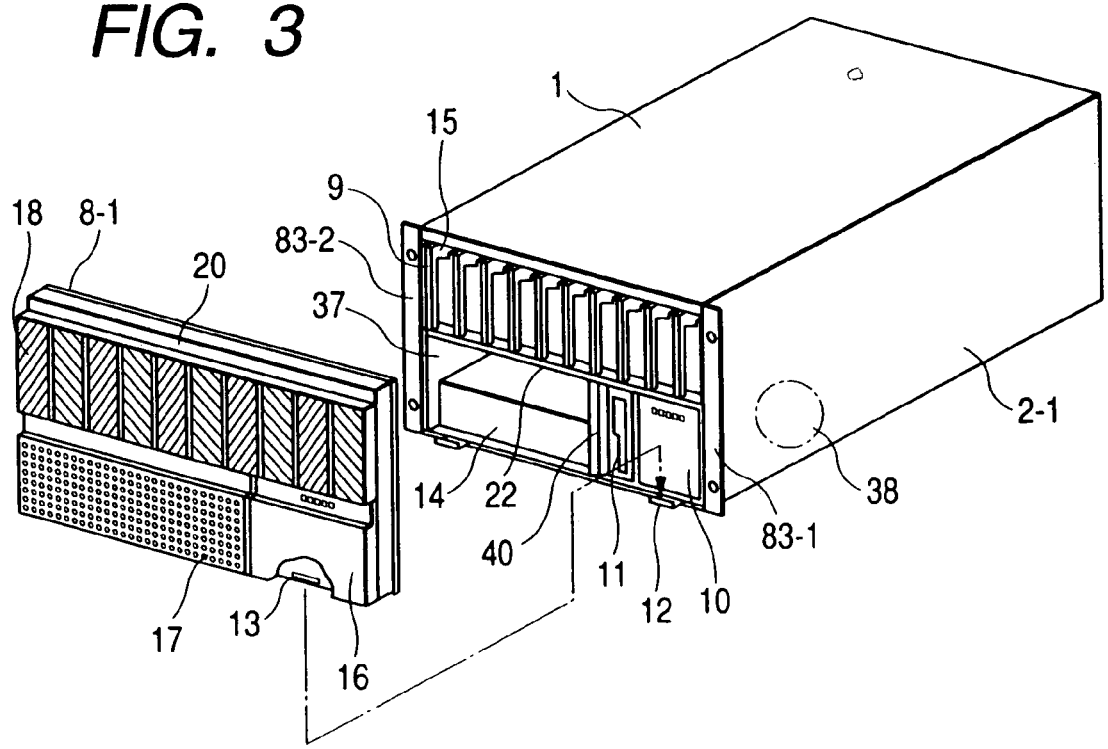
FIG. 3 is a schematic perspective diagram viewed from the front right direction of the disk array apparatus where a cover is removed.

FIG. 3 is a schematic perspective diagram viewed from a front right direction of the disk array apparatus of the present invention where the front door of the disk array apparatus as an example of the information storage apparatus or the information storage control apparatus is removed.

In the main body part, the space on the front surface side is divided into upper and lower spaces by the partition board(3) 22, and plural HDD modules 9 are arrayed in the upper chamber(4) 15. The lower space is divided by the partition board(4) 40. A battery module 14 for protection of information upon instant power-supply stoppage is placed in the chamber(5) 37, and an operating module 10 and an FDD (Floppy Disk Drive) module 11 for obtaining microprogram update/fault information and the like are placed in the chamber(6) 38.

The main body part and the front door can be opened/closed by engagement between a receiver guide 12 and a guide hole 13 and use of special key means (not shown) provided in another place. The special key is employed for the purpose of security of HDD 33 (See FIG. 5) comprising a magnetic disk as a recording medium forming the HDD module 9. The operating cover 16 provided on the front door having a openable/closable structure enables operation of the FDD and the operating module 10.

Figure 4:
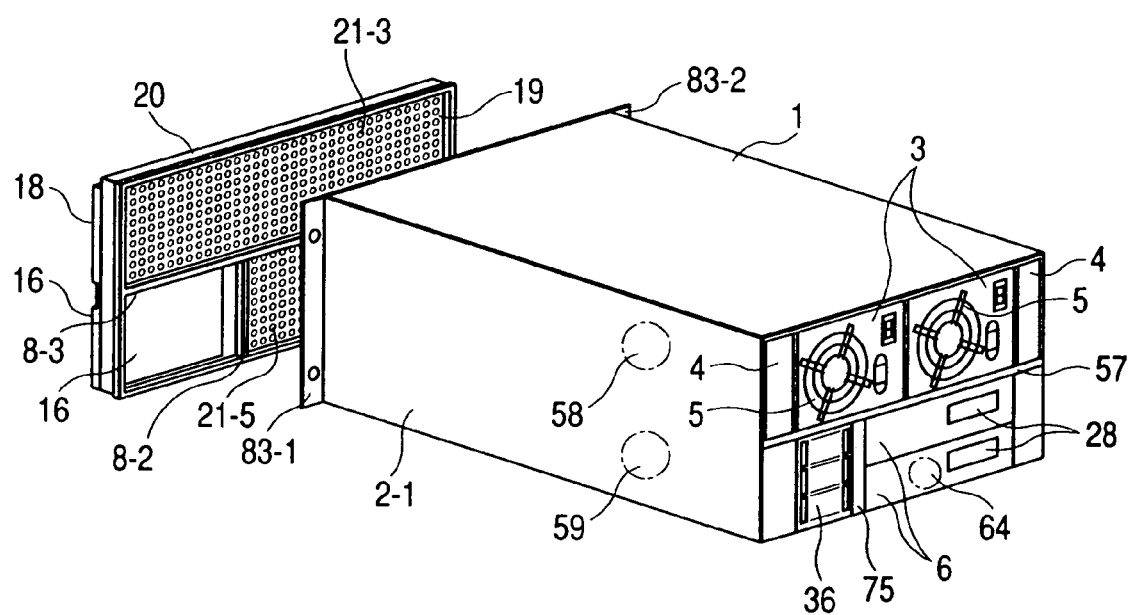
FIG. 4 is a schematic perspective diagram viewed from a rear left direction of the disk array apparatus where the cover is removed.

FIG. 4 is a schematic perspective diagram viewed from a rear left direction of the disk array apparatus as an example of the information storage apparatus or the information storage control apparatus of the present invention where the cover is removed. The front door has a punching plate 19 with plural air intake holes 21-3 for introduction of air to the HDD modules 9 (not shown) and plural air intake holes 21-5 for introduction of air to the battery module 14 (not shown) on its rear surface. In order to reduce noise by attenuating/cutting electromagnetic waves emitted from the various modules contained in the main body part, the EMI gasket(1) 8-1 (not shown), the EMI gasket(3) 8-3 and the EMI gasket(2) 8-2 are attached to the door such that the EMI gasket(1) 8-1 is in contact with a frame surrounded by the bending places 83-1 and 83-2 and the lower plate 7 forming the lower wall (not shown), the EMI gasket(3) 8-3 is in contact with the partition board(3) 22 (See FIG. 3), and the EMI gasket(2) 8-2 is in contact with the partition board(4) 40 (See FIG. 3).

Although various types of EMI (Electro Magnetic Interference) gaskets are known, a gasket having a conductive function on its outer surface of the packing and having an electric resistance value equal to or less than 1 Ω/cm is desirable. Further, to prevent ill effect by interference between electromagnetic waves emitted from the inside the apparatus, the EMI gasket may be inserted into a gap. Further, a currently commercially available EMI gasket may be used as packing, also for the purpose of noise reduction.

The rear surface side space in the main body part is divided into upper space and lower space by the partition board(1) 57. The chamber(1) 58 as the upper space contains a power supply 3 including a fan 5, and a relay module 4 for information transmission/reception with another external storage apparatus such as a disk array apparatus, on the exhaust side for individual or redundancy.

The lower space is divided into the partition board(4) 40 (See FIG. 3). The chamber (3) 59 as one chamber contains a control module 6 and the like for individual or redundancy including an interface part 28. The chamber(2) 64 as the other space contains a fan module 36 and the like for cooling the control module 6.

Figure 5:
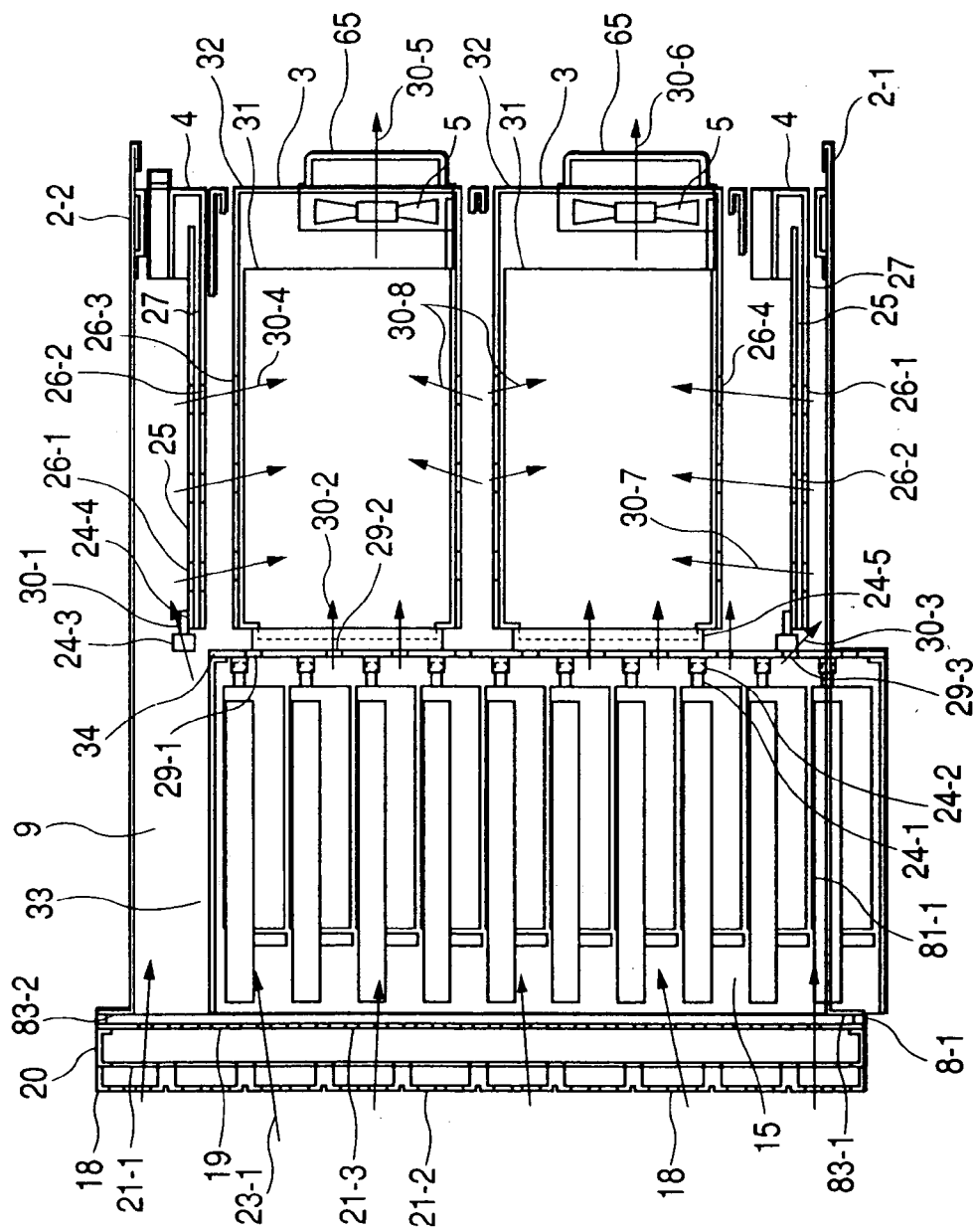
FIG. 5 is a schematic cross-sectional diagram cut along a line A—A in FIG. 2.
Figure 7:
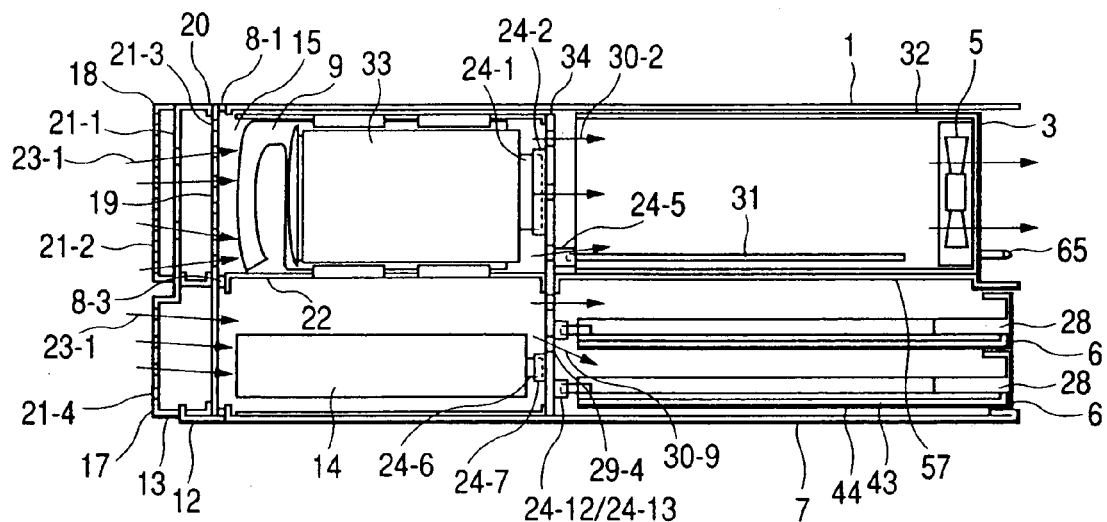
FIG. 7 is a schematic cross-sectional diagram cut along a line C—C in FIG. 2.

FIG. 5 is a cross-sectional diagram cut along a line A—A in FIG. 2. FIG. 7 is a cross-sectional diagram cut along a line C—C in FIG. 2. In the main body part, the arrayed HDD modules 9 including a connector 24-1 as a constituent member of the HDD 33 are placed on the front side, and are connected to a connector 24-2 on the wiring board 34. On the rear side of the wiring board, provided are a power supply board 31 including a shape corresponding to an AC/DC conversion circuit (not shown) and a connector 24-5, the fan 5 downstream of air channel, a power supply chassis 32 with holes 26-3 and 26-4 covering these components, a handle 65 for attachment/detachment, and the like, and the power supply 3 with which the connector 24-5 on the wiring board 34 is connected.

The relay module 4 is provided in space between the side plates 2-1 and 2-2 forming the right and left walls, and adjacent to the power supply 3. The relay module 4 has holes 26-1, a printed board 25 with the connector 24, a relay module chassis 27 with holes 26-2 covering the printed board, attachment/detachment mechanism (not shown) and the like. A connector 24-3 on the wiring board 34 is connected to the connector 24-4. The louver 18 on the front door has air holes 21-2, the cover 20 has holes 21-1, and the punching plate 19 has air holes 21-3.

The disk array apparatus has a dimensions within a range determined by EIA STANDARD or ANSI STANDARD RS-310, and can be placed in a 19-inch (type 19) rack case. More specifically, in the disk array apparatus, an array of 10 HDD modules 9 each including a 3.5 type HDD having a size of 41.1 mm (w)×101.6 mm (h) (3.5 inches), within a dimension defined by the side plates 2-1 and 2-2 forming the right and left walls.

Outside air is introduced from the holes 21-2 of the front door, and plural types of air channels, e.g., an air channel exhausted along arrows 23-1, 30-2 30-8 and 30-5, an air channel exhausted along the arrows 23-1, 30-2, 30-8 and an arrow 30-6, an air channel exhausted along the arrow 23-1, arrows 30-1 and 30-4 and the arrow 30-5, and an air channel exhausted along the arrow 23-1, arrows 30-3 and an arrow 30-7 and the arrow 30-6, are formed.

Since the HDD 33 included in the HDD module 9 is provided in an air channel exhausted by the fan 5 included in the power supply 3, the introduced outside air is directly forwarded to the HDD 33, thereby the HDD 33 is protected from high temperatures. Further, the relay module 4 including various electric devices is provided in the air channel along the arrows 30-4 and 30-7, thereby the module is cooled.

Figure 6:
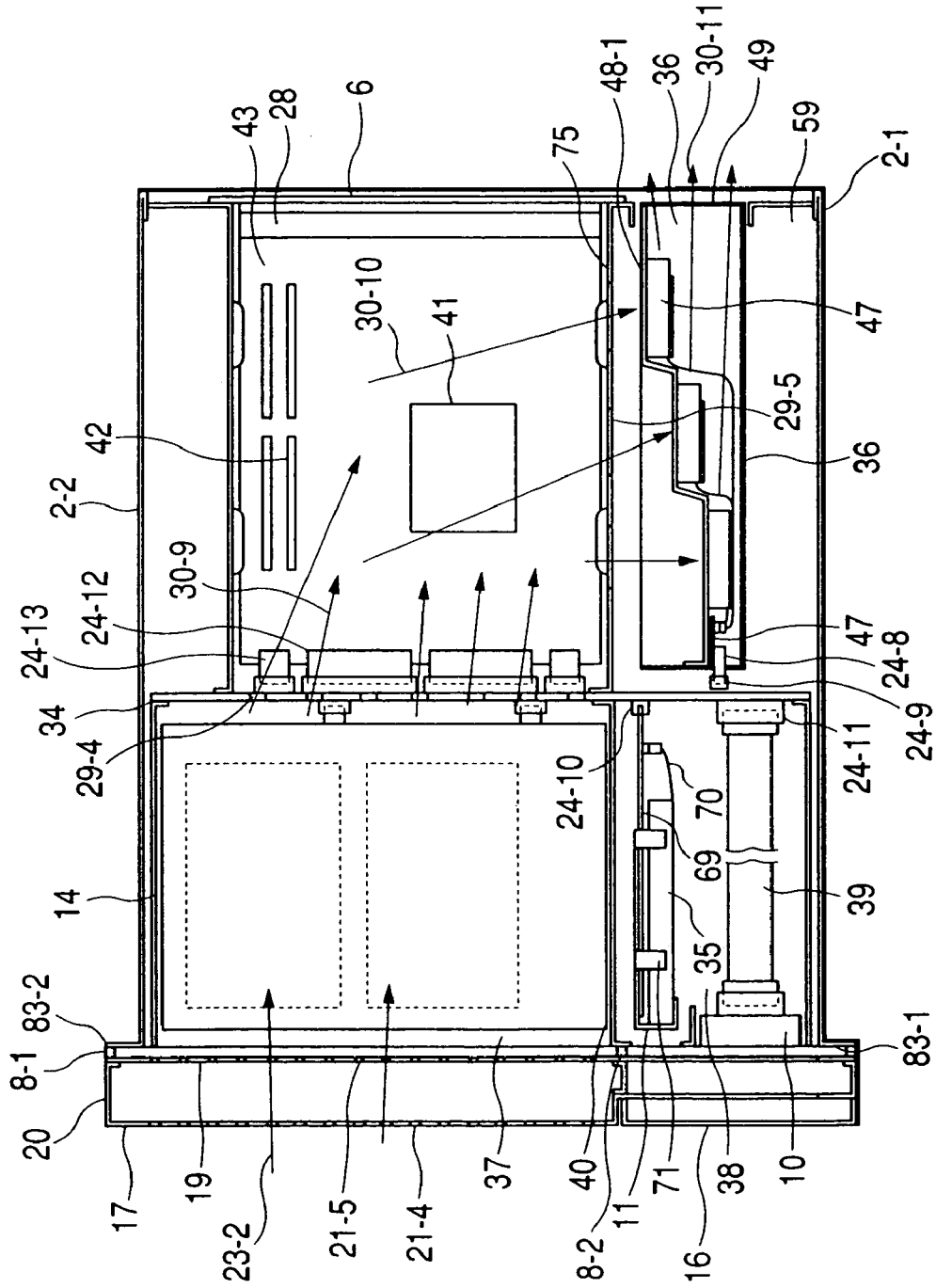
FIG. 6 is a schematic cross-sectional diagram cut along a line B—B in FIG. 2.
Figure 8:
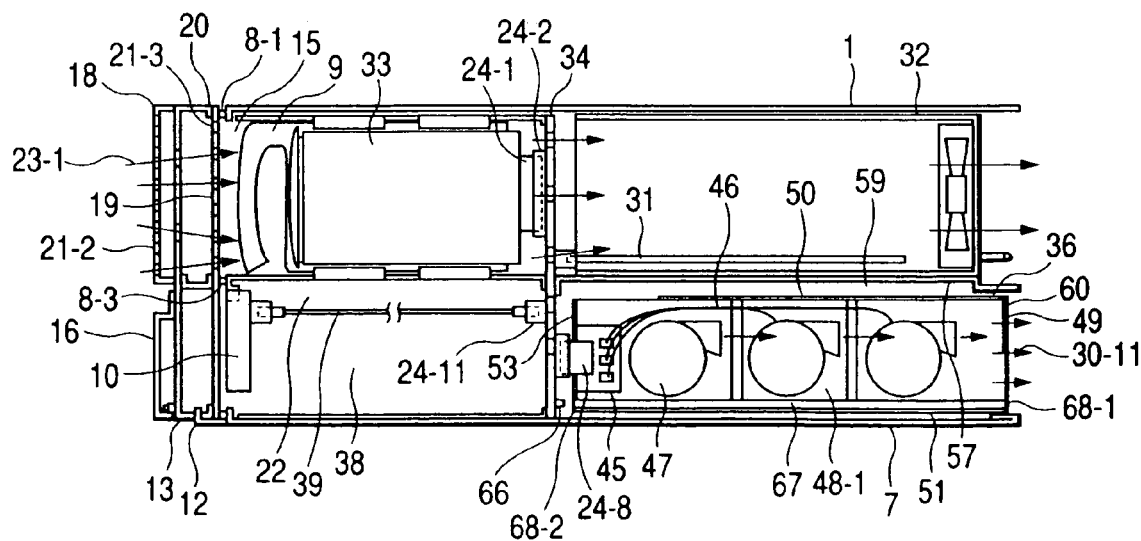
FIG. 8 is a schematic cross-sectional diagram cut along a line D—D in FIG. 2.

FIG. 6 is a cross-sectional diagram cut along a line B—B in FIG. 2. FIG. 8 is a cross-sectional diagram cut along a line D—D in FIG. 2. In the main body front part, the battery module 14 including a connector 24-6 (See FIG. 7) is accommodated in the chamber(5) 37 surrounded by the lower plate 7 forming the lower wall, the side plate 2-2 forming the left wall, the partition plate(3) 22, the partition board(4) 40 and the wiring board 34. A connector 24-7 (See FIG. 7) is placed, then the wiring board 34 having the holes 29-4 corresponding to the chamber(5) 37 is provided, and the connector 24-6 is connected with the connector 24-7.

On the other hand, the FDD module 11 having and FDD 35, an FDD relay board 69 with male sub edge connector on one end, an FDD relay cable 70 with a relay connector and an FDD chassis 71 is accommodated in the chamber(6) 38 surrounded by the lower plate 7 forming the lower wall, the side plate 2-1 forming the right wall, the partition board(3) 22, the partition board(4) 40 and the wiring board 34. A connector 24-10 on the wiring board 34 is connected with the male sub edge connector of the FDD relay board 69. Further, the operating module 10 including a relay cable 39 with a connector is also accommodated in the chamber(6) 38, and the module can be visually checked by opening/closing the operating cover 16. The relay cable 39 is connected with a connector 24-11 on the wiring board 34.

In a portion in the rear of the wiring board 34, provided is the chamber(2) 64 surrounded by the lower plate 7 forming the lower wall, the side plate 2-2 forming the left wall, the partition board(1) 57, the partition board(2) 75 and the wiring board 34. The control module 6, having an MPU 41, a cache memory 42, a control board 43 with a connector 24-12 (See FIG. 7) and a connector 24-13 (See FIG. 7), and a controller chassis 44 (See FIG. 7) supporting the control board 43 and covering the rear surface side, is connected with the connectors 24-12 and 24-13 on the wiring board 34. The MPU 41 on the control board 43 is provided in a position surrounded by the cache memory 42, the partition board(2) 75 and the controller chassis 44 (See FIG. 7). An air channel is formed in the same direction as the lengthwise direction of the apparatus. The cache memory 42 is placed in the air channel.

On the other hand, the fan module 36 is accommodated in the chamber(3) 59 surrounded by the lower plate 7 forming the lower wall, the side plate 2-1 forming the right wall, the partition board(1) 57, the partition board(2) 75 with the holes 29-5 and the wiring board 34.

Next, means for reducing the space of the control module will be described.

The dimensions of the disk array apparatus are defined within a range where the apparatus can be placed in a 19 type rack frame. To place 10 HDDs 33 having a thickness of about 41.1 mm within the range, it is preferable that 10 HDD modules 9 each including HDD attachment/detachment member are arrayed in the widthwise direction of the apparatus. Further, regarding the size of the power supply 3 (See FIG. 7), minimum dimensions are determined in consideration of mounting components sufficient to supply necessary electric energy for operations of the respective parts. Further, the size of the fan module 36 is determined in consideration of fan to sufficiently supply air necessary for cooling the respective parts. Accordingly, if the modules constructing the disk array apparatus have the same construction, the sizes of the power supply 3 and the fan module 36 must be the same.

The size of the control module 6 depends on components included in the module. As the HDD used in the disk array apparatus, an SCSI interface has been used. One SCSI interface allows connection with up to 8 SCSI devices (16 devices in WIDE SCSI). Further, regarding a RAID constructing technique, to support striping i.e. dividing data and writing divided data into plural HDDS, it has been necessary to provide SCSI controllers corresponding to the number of HDDs for the striping. Recently, as a main-stream interface for HDDs for high-speed transfer, fiber channel type interfaces have been introduced.

The fiber channel type interface allows connection between one fiber channel controller and 127 fiber channel devices. Further, as transfer can be performed at a higher speed than the transfer speed in case of SCSI, one controller enables striping using plural HDDs. Accordingly, in a case where striping is to be performed by using 5 HDDs, one fiber channel controller can realize the striping in place of 5 SCSI controllers. Further, in consideration of capacity of the combination of the control module 6 and a host interface, the SCSI interface and the fiber channel interface are compared with each other. The SCSI as an interface requires a connection area larger than that of the fiber channel interface. In other words, the fiber channel interface can be installed in a smaller area.

When the module has a construction in correspondence with 2 host interfaces, SCSI and fiber channel interfaces, if interface modules having the same size are prepared and connected to the control module, the construction can be realized only by simple interface selection. However, in a case where the fiber channel interface requiring a small installation area is incorporated as a standard interface in the control module, the capacity of the control module and the interface module can be small. Accordingly, if the fiber channel interface is prepared as a standard interface on the HDD connection side and the host interface side, the capacity of the control module itself and the capacity of the control module and the host interface can be reduced.

In this arrangement, the outside air is introduced from the holes 21-4 of the front door, and is exhausted along arrows 23-2, 30-9, 30-10 and 30-11. The cache memory 42 on the control board 43 may be slanted for causing natural curve of the air channel.

Figure 9:
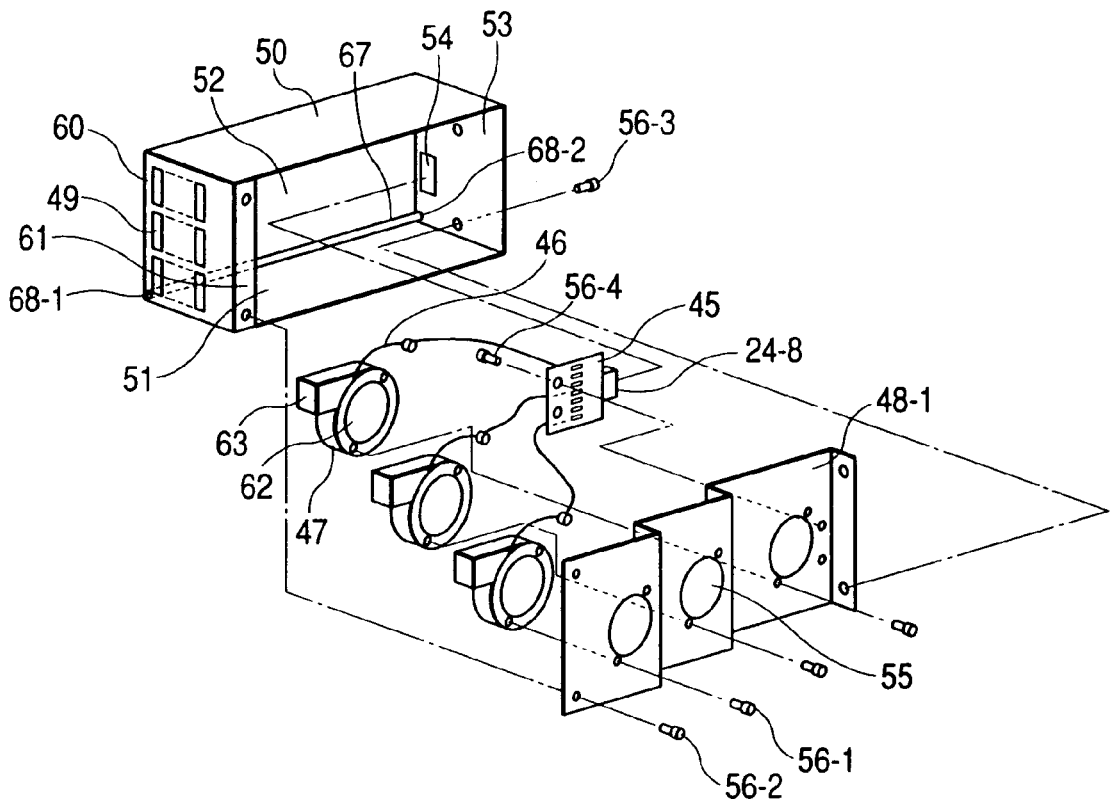
FIG. 9 is a schematic exploded perspective diagram showing a fan module.

FIG. 9 is a schematic exploded perspective diagram showing the fan module 36. A fan relay board 45, connected to a connector 24-8 connected with a connector 24-9 on the wiring board 34 and a connector attached to a cable 46, and, including another connector, is connected via the cable 46 having the connector with stepwisely formed SIROCCO fans 47. The fan relay board 45 is attached to a fan bracket 48 having holes 55, with screws 56-4. On the other hand, the SIROCCO fans 47 are attached to the fan bracket 48-1 with screws 56-1. The fan module 36 is formed by fastening the assembly of fan bracket 48-1, with screws 56-2 and 56-3, in a box formed with an upper plate 50, a lower plate 51 provided in a position opposite to the upper plate 50, a side plate 52, a bottom plate 53 with holes 54, a front plate 60 with holes 49 and a side plate 61 provided in a position opposite to the side plate 52. When the SIROCCO fan is provided with power and wings of the stator rotate, air flows through the hole 55, an inhalation opening 62, an exhaust opening 63 and the holes 49 and is exhausted.

Figure 11:
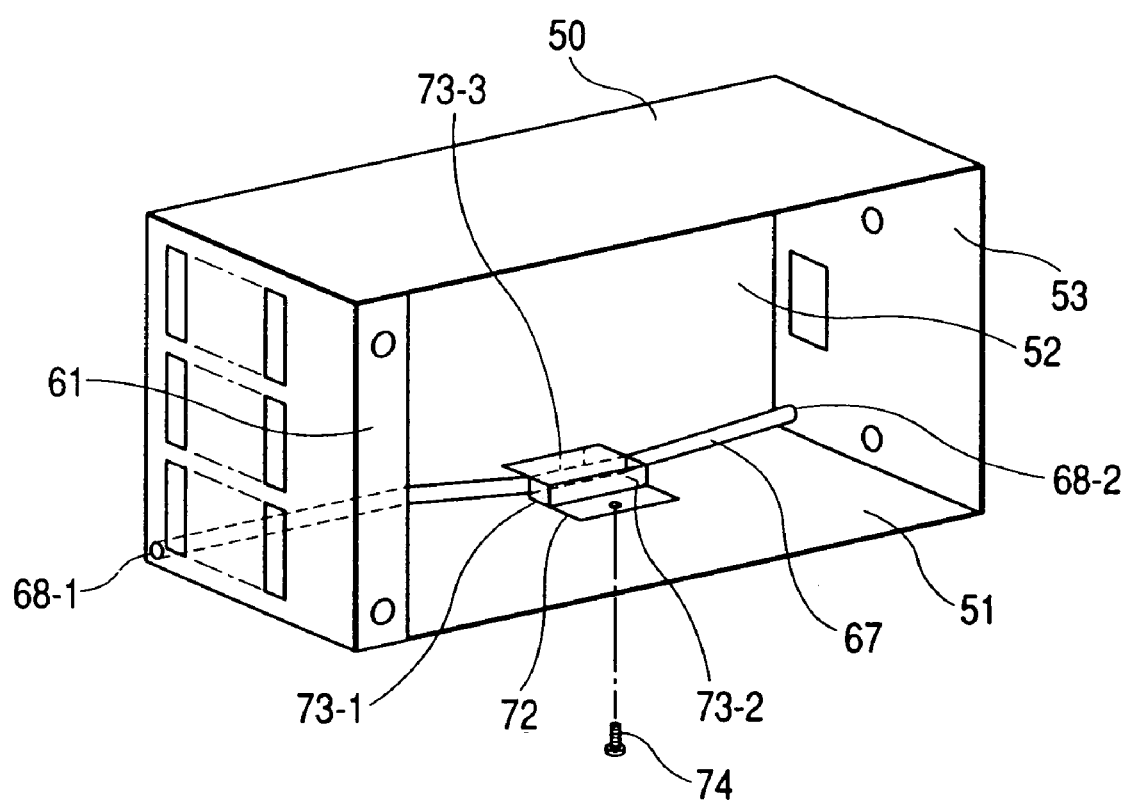
FIG. 11 is a schematic exploded perspective diagram showing optical fiber fixing means.

The SIROCCO fan 47 installed in the fan module 36 has an electric circuit to monitor the number of revolutions of the stator. When it is determined based on reduction of the number of revolutions that a fault occurred in the stator, an electric signal is outputted, and an LED 66 (See FIG. 8) mounted on the wiring board 34 (See FIG. 8) is turned on. The bottom plate 53 and the front plate 60 of the fan module 36 have holes 68-1 and 68-2 approximately in a straight line, holding an optical fiber 67. When the LED 66 is turned on, light is transmitted to the front plate 60 side, thereby abnormality of the SIROCCO fan can be checked by visual observation. The movement of optical fiber is prevented by attachment or metal fixing means. Further, as shown in FIGS. 11 to 13, it may be arranged such that a nail 73-3 is formed on one side and nails 73-1 and 73-2 are formed on the opposite side, then the optical 67 is partially held and bent by the fixed metal 72 and the nails 73-1 to 73-3, and is fixed to the lower plate 51 with a screw 74.

In the conventional cooling structure to perform inhalation from a front surface and exhaust to a rear surface, a fan like the fan 5 used in the present invention is attached to the rear surface. The fan of this type has exhaust performance lower than that of SIROCCO fan. On the other hand, the SIROCCO fan has improved exhaust performance, however it emits large noise. For example, in a structure having a SIROCCO fan on the surface of apparatus rear surface as described in Japanese Unexamined Patent Publication No. H2-58900, the noise is leaked to the outside. In the present invention, the SIROCCO fan is not provided on the apparatus surface but is placed inside the apparatus. It is preferable that air channel is bent and the fan is provided by the side of the air channel.

Figure 10:
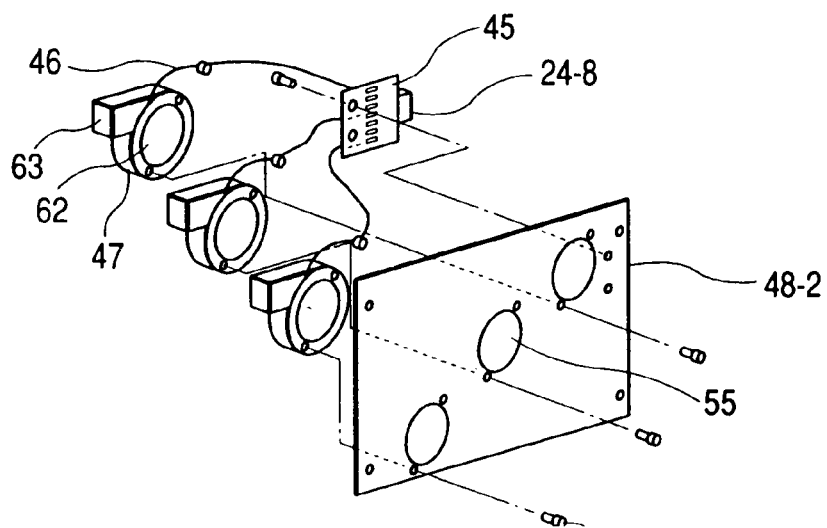
FIG. 10 is a schematic exploded perspective diagram showing a fan bracket.

In FIG. 9, the fan bracket 48-1 has a step form in a direction orthogonal to a widthwise direction of the upper plate 50 and the lower plate 51 due to dimensional limitation. However, if there is more space in the widthwise direction of the upper plate 50 and the lower plate 51, it may be arranged such that diagonally-arrayed SIROCCO fans 47 are attached to a fan bracket 48-2 having a flat form instead of step form, as shown in FIG. 10.

Next, an attachment/detachment structure for the relay module 4 will be described below.

Figure 14:
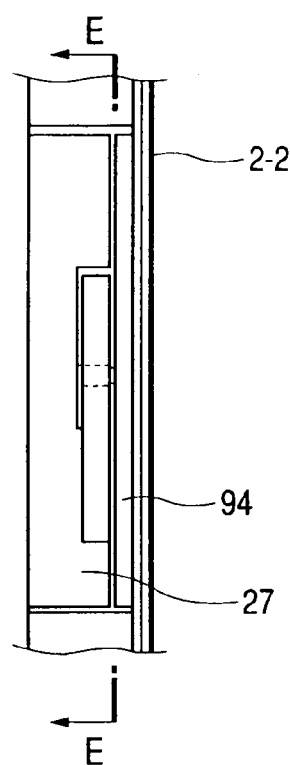
FIG. 14 is a schematic front diagram showing a relay module mounting portion.
Figure 15:
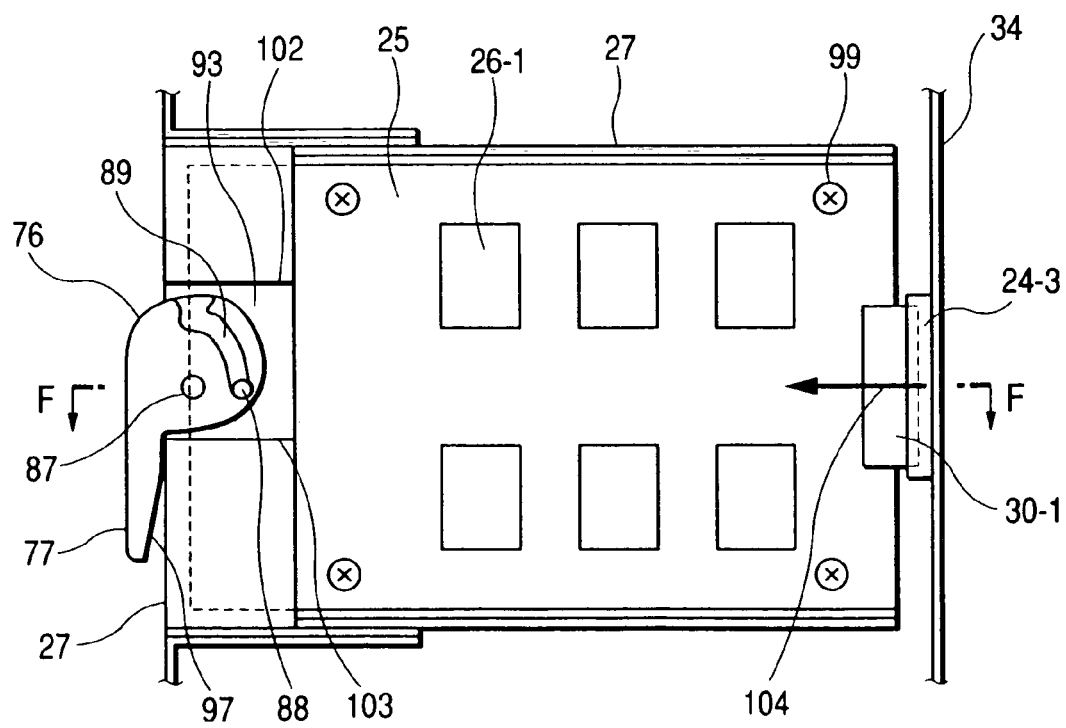
FIG. 15 is a schematic cross-sectional diagram cut along a line E—E in FIG. 14.
Figure 16:
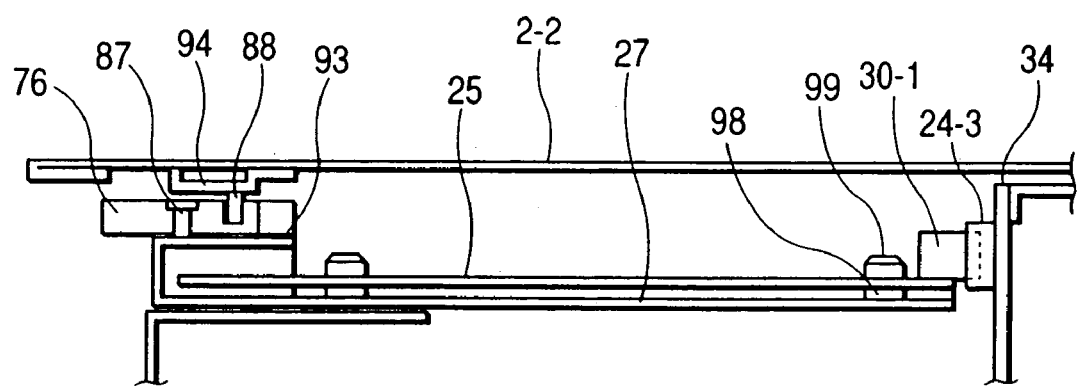
FIG. 16 is a schematic cross-sectional diagram cut along a line F—F in FIG. 14.

FIG. 14 is a schematic front diagram showing a relay module mounting portion (See FIG. 5) of the present invention. FIG. 15 is a schematic cross-sectional diagram of the relay module mounting portion cut along a line E—E in FIG. 14. FIG. 16 is a schematic cross-sectional diagram of the relay module mounting portion cut along a line F—F in FIG. 14.

In the relay module mounting portion, a U form plate 94 is fixed to the side plate 2-2, the relay module 4 is inserted in a position adjacent to the U form plate, and the wiring board 34 with the connector 24-3 is provided in a position corresponding to a connector 30-1. A projection shaft 88 is fixed to the U form plate 94, and the U form plate is a little smaller than the width of a curve form ditch 89.

When the insertion of attachment/detachment cam 76 of the relay module 4 has been completed, electrical connection is completed between the connector 24-3 on the wiring board 34 and the connector 30-1. a slope 97 is provided for facilitating a user's holding a handle 77. If the entire electronic device has a sufficient size, the slope can be omitted.

Referring to FIG. 15, support of the inserted relay module 4 will be described. When the insertion of the relay module 4 has been completed, the wiring board 34 still has a slightly deformed portion as internal stress, and a force acts on a direction to discharge the relay module 4 via the connector 24-3, thereby the projection shaft 88 is not ejected from a curving ditch typed project 92 (See FIG. 18). Further, as a turning shaft 87, the projection shaft 88 and an arrow 104 representing a reaction force of the wiring board 34 are approximately positioned on a straight line, the inserted module 4 is maintained in this status.

As shown in FIG. 16, the printed board 25 is floated from the relay module chassis 27 via a spacer 98 such that the relay module chassis 27 and the printed board 25 are not in direct contact with each other. In this status, the printed board 25 is fixed to the relay module chassis 27 by a screw 99.

Figure 17:
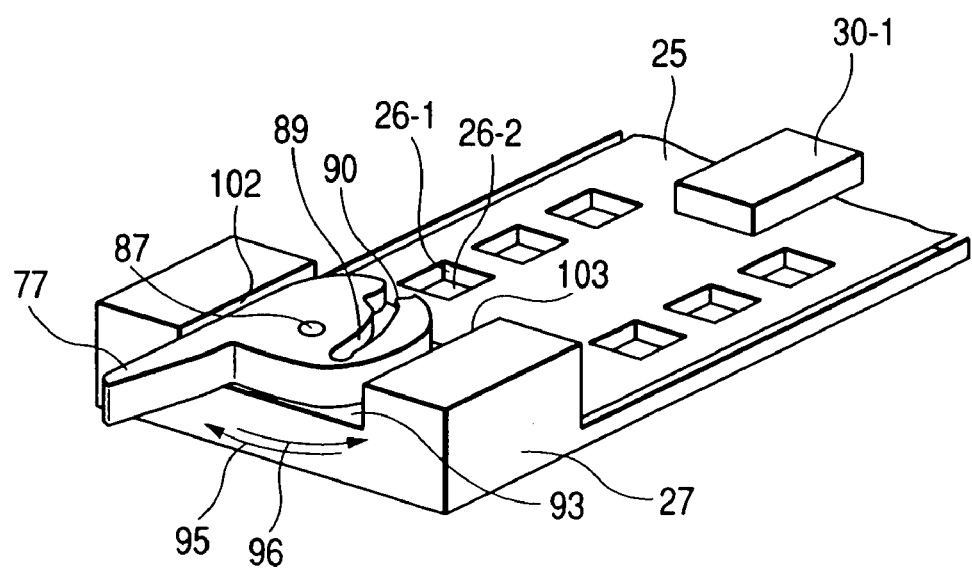
FIG. 17 is a schematic perspective diagram showing the relay module.

FIG. 17 is a perspective diagram schematically showing the relay module of the present invention. The relay module chassis 27 has holes 26-2, and the printed board 25 side with the connector 30-1 has holes 26-1 in positions corresponding to the holes 26-2. On the other hand, on a stand 93, the turning shaft 87 is inserted into a hole 100 (See FIG. 18) so as to prevent the attachment/detachment cam 76 from dropping, and the rotation (arrows 95 and 96) of the handle 77 is restrained between walls 102 and 103.

Figure 18:
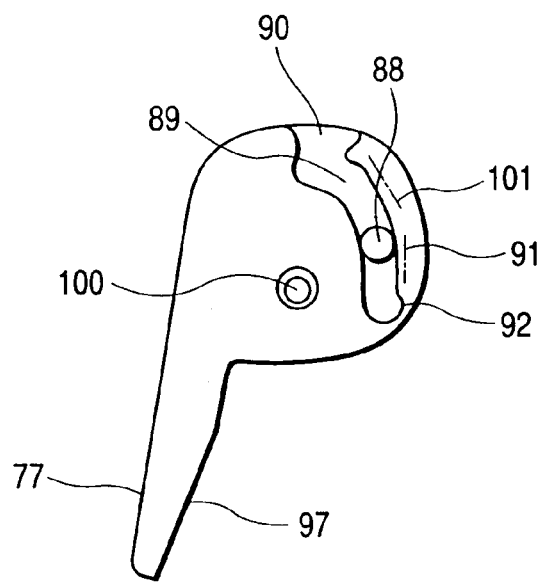
FIG. 18 is a schematic plan diagram showing an attachment/detachment cam.

FIG. 18 is a plan diagram schematically showing the attachment/detachment cam 76. The attachment/detachment cam 76 has the hole 100 with difference in level into which the turning shaft 87 is inserted, the handle 77 with the slope 97, and the curve form ditch 89 including a guide 90 with extension, a curve line 101 with a predetermined curvature and a linear portion 91 with fixed limits and the curving ditch typed project 92. The attachment/detachment cam 76 has flat upper and lower surfaces.

Figures 19A, 19B, 19C:
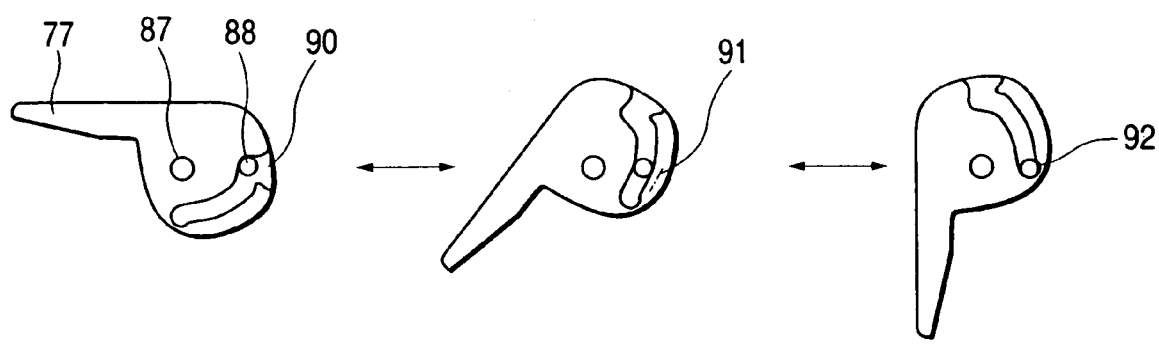
FIGS. 19A to 19C are schematic explanatory views showing the operation of the attachment/detachment cam.

FIGS. 19A to 19C are explanatory views showing the operation of the attachment/detachment cam when the relay module is attached/detached. The relay module 4 is inserted in accordance with FIGS. 19(A), 19(B) and 19(C). The projection shaft 88 is moved to the guide 90, then the handle 77 is turned in the direction of the arrow 96, then the projection shaft 88 reaches the curving ditch typed project 92 and positioned there. Thus the insertion is completed.

As shown in FIG. 16, the engagement force for engaging the connector 24-3 with the connector 30-1 acts to deform the wiring board 34. Since there is a probability that this force destroys the wiring board 34, the engagement between connectors is performed such that the relay module 4 is inserted to a certain position, so as to keep a balance between the engagement force between the connectors 24-3 and 30-1 and the reaction force of the wiring board 34 to the deformation. In a case where the portion 91 as the limit of insertion has a curvature, if the handle 77 is further turned in the arrow 96 direction after the engagement between the connectors, the projection shaft 88 falls in the curving ditch typed project 92, and the deformation of the wiring board 34 is released to a mechanically allowable range of reaction force.

When the relay module 4 is removed, the removal is performed in accordance with FIGS. 19(C), 19(B) and 19(A). When the handle 77 is turned in a direction represented by the arrow 95, the projection shaft 88 moves from the curving ditch typed project 92, passes through the curve form ditch 89, and goes out of the guide 90. Thus the relay module 4 is removed.

As described above, regarding an electronic device having a unit in module including a connector for electrical connection to be inserted/withdrawn and a substrate with connector for electrical connection in a position corresponding to a fixed portion in which the unit is inserted, a projection shaft is provided on the fixed portion side to guide the unit to the fixed portion and establish engagement therebetween, while a rotatable axis and a curving ditch typed project having a guide with extension are provided on the unit side for engagement with the projection shaft. The curve of the ditch is formed such that the projection shaft can move in the unit insertion direction, and that the distance between the projection shaft and the unit is approximately fixed within a predetermined range. When the handle attached to insertion/withdrawal means having a projection is turned in the unit insertion direction and the connectors are engaged with each other, the rotational axis is aligned with the position of engagement between the connectors and the position of the projection. In this arrangement, since the insertion/withdrawn means has a comparatively simple and low-cost structure, electrical connection can be mechanically made single-handedly in a stable manner, by using this structure.

The present invention is not limited to the above embodiments and various changes and modifications can be made within the spirit and scope of the present invention. Therefore, to appraise the public of the scope of the present invention, the following claims are made.

What is claimed is:

1. An information storage apparatus comprising:
   a first section including a plurality of storage media for storing information;
   a second section including a power supply unit supplying power to a control unit which is incorporated with a controller that controls access to said storage media, said second section being placed adjacent to said first section;
   a third section including a battery module supplying power to said control unit when said power supply units stops supplying power to said control unit, said third section being placed adjacent to said second section;
   a fourth section including said control unit and a first fan for cooling said control unit by exhausting air through said control unit in said fourth section, said air being hailed from at least one of the sections except said second section , said fourth section being placed adjacent to said third and second section;
   a wiring board placed in between a first group of sections and a second group of sections in said sections, the first group of sections including said first section and said third section and said second group of sections including said second section and said fourth section; and
   a first partitioning board for partitioning between said second section and said fourth section;
   wherein, said first fan works to cool said control unit in said fourth section, and said first partitioning board stops air in said second section from being hailed by said fourth section.

2. The information storage apparatus according to claim 1, wherein said control unit has a structure enabling to insert/withdraw into/from said fourth section, from/to the outside of said first section.

3. The information storage apparatus according to claim 1, wherein said control unit has an interface for connection with the outside of said first section.

4. The information storage apparatus according to claim 3, wherein a direction of an exhaust hole of said first fan for cooling said control unit, and the direction of said interface for connection with the outside of said first section are the same.

5. The information storage apparatus according to claim 1, wherein said first fan for cooling said control unit is a multiple blade centrifugal blower.

6. The information storage apparatus according to claim 1, wherein a plurality of said first fans for cooling said control unit are installed in said fourth section.

7. The information storage apparatus according to claim 1, wherein said second section further has a second fan for cooling said first and said second sections.

8. The information storage apparatus according to claim 7, wherein air hailed by said second fan comes through said plurality of storage media implemented in said first section, and then through said power supply unit implemented in said second section.

9. The information storage apparatus according to claim 1, wherein said first and second sections each has a structure ventilatable through a first hole made in said wiring board, and said third and fourth sections each has a structure ventilatable through a second hole made in said wiring board.

10. The information storage apparatus according to claim 9, wherein said second section further has a second fan for cooling said first and second sections.

11. The information storage apparatus according to claim 10, wherein air hailed by said second fan comes through said plurality of storage media implemented in said first section, said first hole made on said wiring board, and said power supply unit implemented in said second section.

12. The information storage apparatus according to claim 1, wherein said first section and said third section have a structure partitioned by a second partitioning board.

13. The information storage apparatus according to claim 1, wherein air hailed by said first fan for cooling said control unit comes through said battery module implemented in said third section, and then through said control unit implemented in said fourth section.

14. The information storage apparatus according to claim 1, wherein said first section and said third section, are placed at the front side of said first section, and are separately placed one on the upper side, and the other on the lower side; and
   said second section and said fourth section, are placed at the rear side of said first section, and are separately placed one the upper side, and the other on the lower side.

15. The information storage apparatus according to claim 1, wherein said second section further has a relay module for performing information transmission/reception between another information storage device.

16. The information storage apparatus according to claim 15, wherein said second section has a plurality of the relay modules with the structure of sandwiching said power supply unit.

17. The information storage apparatus according to claim 15, wherein said second section further has a second fan for cooling said first and said second sections.

18. The information storage apparatus according to claim 17, wherein said relay module has a third hole through which air hailed by said second fan passes; and
   said air hailed by said second fan comes through said plurality of storage media implemented in said first section, said third hole made in said relay module, and said power supply unit implemented in said second section.

19. The information storage apparatus according to claim 1, wherein a plurality of said control units are installed in said fourth section.

20. The information storage apparatus according to claim 19, wherein said apparatus side has a projection shaft such that said control unit side is guided and engaged, and said control unit side has a rotatable axis and a curving ditch type projection different from said rotational axis, and further, said ditch has an extension for engagement with said projection shaft.

21. The information storage apparatus according to claim 1, wherein a plurality of said power supply units are installed in said second section.

* * * * *